(12) United States Patent
Nagda et al.

(10) Patent No.: US 8,624,653 B2
(45) Date of Patent: Jan. 7, 2014

(54) CIRCUIT AND METHOD FOR DETERMINING COMPARATOR OFFSETS OF ELECTRONIC DEVICES

(75) Inventors: Miten H. Nagda, Austin, TX (US); Dale J. McQuirk, Ausin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 167 days.

(21) Appl. No.: 13/160,979

(22) Filed: Jun. 15, 2011

(65) Prior Publication Data

US 2012/0319735 A1   Dec. 20, 2012

(51) Int. Cl.
*H03L 5/00* (2006.01)

(52) U.S. Cl.
USPC ............................. 327/307; 330/9; 341/154

(58) Field of Classification Search
USPC ............................. 327/307; 330/9; 341/154
See application file for complete search history.

(56) References Cited

U.S. PATENT DOCUMENTS

| | | | |
|---|---|---|---|
| 5,774,004 A * | 6/1998 | Peng | 327/205 |
| 6,111,965 A * | 8/2000 | Lubbe et al. | 381/94.5 |
| 6,377,200 B1 * | 4/2002 | Lee | 341/155 |
| 6,433,822 B1 | 8/2002 | Clark et al. | |
| 7,375,670 B1 * | 5/2008 | Wang et al. | 341/145 |
| 7,589,650 B2 * | 9/2009 | Hsien et al. | 341/118 |
| 7,791,519 B2 | 9/2010 | Matsukawa et al. | |
| 7,924,044 B2 | 4/2011 | Ma | |
| 8,169,249 B2 * | 5/2012 | Li et al. | 327/307 |
| 2001/0026173 A1 | 10/2001 | Schneider et al. | |
| 2004/0222810 A1 | 11/2004 | Frankowsky et al. | |

OTHER PUBLICATIONS

Junichi Goto et al, Embeded Compact Test Structure with a Comparator for Rapid Device Characteristic Measurement, IEEE 2000, Device Analysis Technology Labs., NEC Corp., Nakahara, Kawasaki, Japan, 4 pages.

* cited by examiner

*Primary Examiner* — Kenneth B. Wells

(57) ABSTRACT

A device includes a comparator, and a selection circuit coupled to the inputs of the comparator. The selection circuit receives reference voltages and a variable voltage. In a normal operation mode, the selection circuit provides the variable voltage and a selected reference voltage to the comparator and the comparator provides an indication based on the variable voltage. In a test mode, the selection circuit provides a first selected reference voltage and a second selected reference voltage to the comparator for determining a switching offset voltage of the comparator.

20 Claims, 6 Drawing Sheets

US 8,624,653 B2

1

CIRCUIT AND METHOD FOR DETERMINING COMPARATOR OFFSETS OF ELECTRONIC DEVICES

FIELD OF THE DISCLOSURE

The present disclosure relates generally to electronic devices and more particularly to determining comparator switching offsets of comparators integrated at electronic devices.

BACKGROUND

Electronic devices can include analog and digital components to implement various functional elements such as digital functions, high and low frequency analog functions, and combinations thereof. The analog and digital components can provide a power management system that supplies voltages that are regulated to vary by only a small amount in order to provide voltages that power various other functional elements of the device. The analog and digital components can also provide various indicators of the condition or status of the regulated voltages that the power management system provides or of other variable voltages. The status indicators can be utilized by the various functional elements of the device, or can be provided as signal outputs from the device. A power management system of a device can include a number of comparators that provide such indicators in order to perform various functions in providing regulated voltages. The accuracy of the indicators, and thus the stability of voltage power rails generated by a voltage regulator of a power management system, can depend on the switching offsets of the comparators.

BRIEF DESCRIPTION OF THE DRAWINGS

The present disclosure may be better understood, and its numerous features and advantages made apparent to those skilled in the art by referencing the accompanying drawings. Embodiments incorporating teachings of the present disclosure are shown and described with respect to the drawings herein, in which.

The use of the same reference symbols in different drawings indicates similar or identical items.

DETAILED DESCRIPTION

Figure 1:
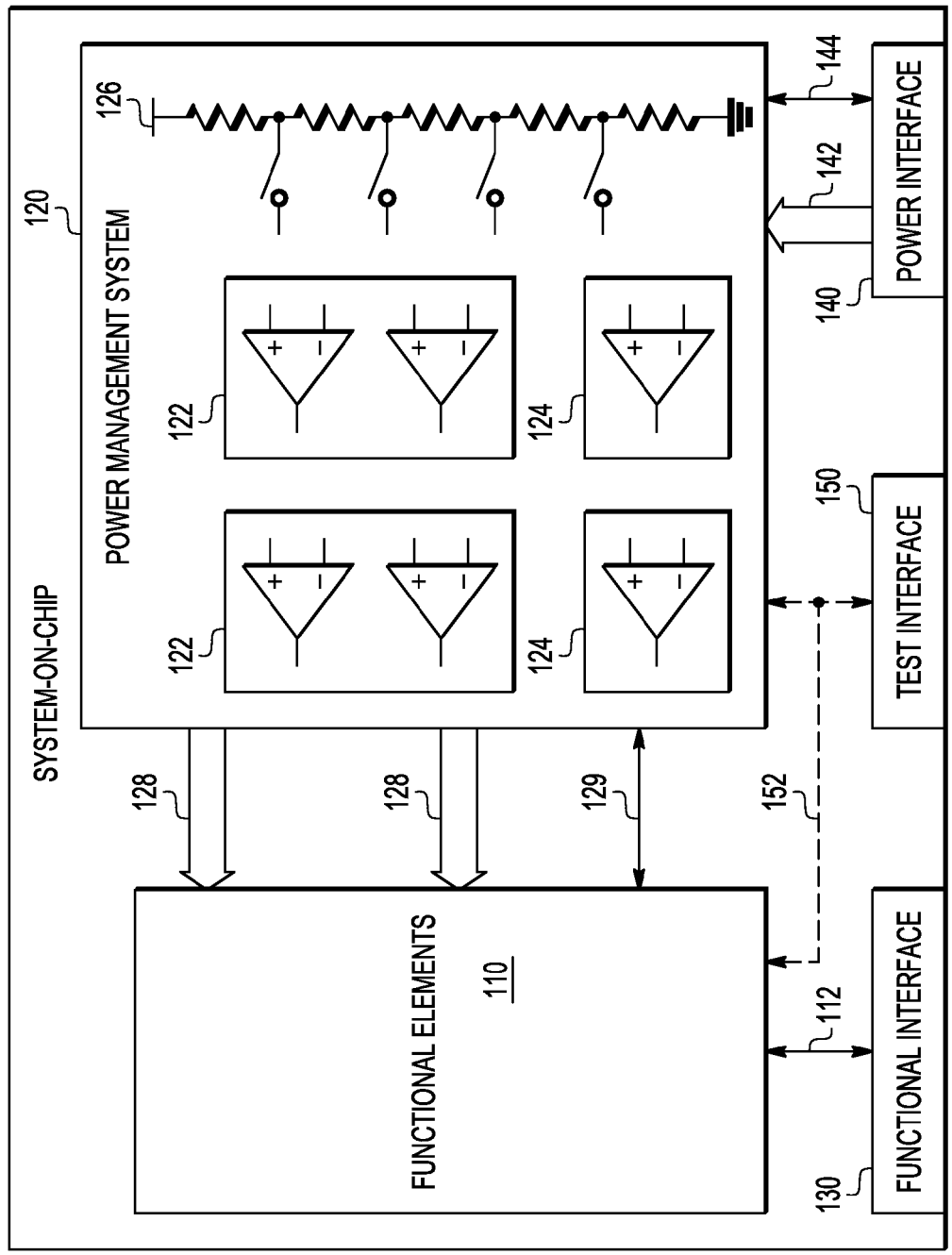
FIG. 1 is a block diagram illustrating an electronic device, according to an embodiment of the present disclosure.

An integrated circuit device can include various test interfaces and features that permit a manufacturer of the device to test the device. For example, the device can include input and output pads that permit a functional tester to access features of the integrated circuit directly or indirectly, e.g., through a test structure such as a scan chain, to determine the robustness of the device's design, or whether or not a particular device is defective. Test interfaces and features can be operated by controlling the contents of various registers within the device by a tester, or can include a test processor such as a built-in self test (BIST) block or a state machine. Test interfaces and features can be included to test the switching offsets of the comparators of the device.

A power management system integrated with the same device includes multiple comparators and test functionality to test the switching offsets of the comparators. In a particular embodiment, the power management system includes a voltage reference generator having multiple taps to provide a plurality of voltage references. For example, a resistor ladder circuit that operates as a resistor digital-to-analog converter (RDAC) to provide voltages at each one of a plurality of taps. The RDAC operates in a normal operation mode, e.g., not test mode, to provide precision voltage references having sufficient precision to be used by the power management system to set desired voltage reference levels that power portions of the device or that are compared with various power states in the device. In a test mode, e.g., not normal operation mode, the RDAC is used to provide a reference voltage to one input of the comparators of the power management system, and to provide a different voltage, offset from the reference voltage at the positive input, to the other input of the comparators. By sequentially stepping through available taps of the RDAC and monitoring the comparator output signals, a switching offset voltage for each comparator can be determined. In accordance with a particular embodiment, the device can non-intrusively enter test mode, with respect to normal operation and the generation of reference voltages, to determine the switching offsets of comparators.

For example, the reference voltage can be supplied to the positive input of a comparator from one tap of the RDAC, and a lower voltage offset, e.g. a voltage of the same polarity as the reference voltage and a smaller magnitude relative to ground, can be provided from a different tap of the RDAC to the negative input of the comparator. When the difference between the reference voltage and the offset voltage is relatively large (e.g., 10-20 millivolts (mV)), the output of the comparator will be driven to a logic "1." Successively higher voltages (e.g., voltages closer to the reference voltage) can be provided to the negative input of the comparator by selecting other taps of the RDAC, thereby iteratively reducing the voltage between the comparator's positive input and its negative input to determine when the comparator switching offset voltage has been met, as indicated by the comparator output signal switching from the logic "1" to a logic "0."

If, when the tap that provides the smallest possible offset voltage (e.g., 2-5 mV) relative to the reference voltage is selected, the comparator has not switched state, then the reference voltages supplied to the positive and negative inputs of the comparator can be swapped, e.g., the smallest offset voltage is provided to the positive input of the comparator, thereby creating a negative offset voltage at the comparator inputs that has the same magnitude as the smallest possible positive offset voltage. Then, successively lower voltages (e.g., RDAC voltages further from the reference voltage) can be selected, thereby incrementally increasing the negative voltage offset to determine when the comparator switches from the logic "1" to a logic "0."

Once the comparator switches from the logic "1" to a logic "0," the switching offset voltage for the comparator is determined to within a tolerance, e.g., a voltage range defined by the difference between successively selected voltages. If the test mode is used during a production test of the device, then a pass/fail criteria can be applied to the device based upon the switching offset voltages for the comparators of the device. In another embodiment, a negative offset can be applied to the comparator initially, resulting in the output of the comparator being driven to a logic "0," and the offset can be sequenced through the successively lower offsets and to the increasingly positive offsets to determine when the comparator switches from the logic "0" to a logic "1." Further, the relatively large voltage offset can be selected at levels other than 10-20 mV, and the offset voltage step and the smallest offset can be selected at levels other than 2-5 mV, as needed or desired.

FIG. 1 illustrates a device 100 including functional elements 110, a power management system 120, a functional interface 130, a power interface 140, and a test interface 150. Functional elements 110 provide the capabilities and functions of device 100, and include the various elements of the device such as digital functions, analog functions, and combinations thereof. Functional elements 110 are connected via input/output (I/O) interconnects 112 to functional interface 130, and the functional interface 130 provides connectivity between device 100 and a larger system of which the device is a part (not illustrated). Power interface 140 provides connectivity between device 100 and the larger system, and is connected via a main power rail 142 and power status interconnects 144 to power management system 120. Note that the term "power rail", as used herein, is used to refer to either a voltage reference that powers elements of device 100 or a physical connection over which regulated voltage is provided. Power management system 120 includes voltage regulators 122, power indicator modules 124, and an voltage reference generator illustrated as a resistor digital-to-analog converter (RDAC) 126. Test interface 150 provides connectivity between device 100 and a tester system. Test interface 150 is connected via a test bus 152 to functional elements 110 and power management system 120.

In a particular embodiment, main power rail 142 provides power for power management system 120 from an external power supply (not shown) that has a voltage level suitable to the design of device 100, and in particular to the design of the power management system 120. For example, main power rail 142 can provide a voltage of 2-5 V, or another voltage, as needed or desired. Power status indicators provided via power status interconnects 144 can include inputs from the external power supply to indicate the power status of the power supply, outputs from power management system 120 to indicate the power status of device 100, other power status indicator I/O, or a combination thereof. For example, power status indicators can include a power_supply_stable indicator, a power_supply_low indicator, a device_power_warning indicator, a device_power_low indicator, other power status indicators, or a combination thereof. Voltage regulators 122 regulate a voltage received at the main power rail 142 to provide one or more system power rails 128 to the functional elements 110. For example, a first voltage regulator 122 can provide a high voltage system power rail 128 at 1.26 V or another voltage level, as needed or desired, and a second voltage regulator 122 can provide a low voltage system power rail 128 at −1.26 V or another voltage level, as needed or desired. Power status indicators 129 can be similar to power status interconnects 144, or can include other power status indicators, as needed or desired.

Figure 2:
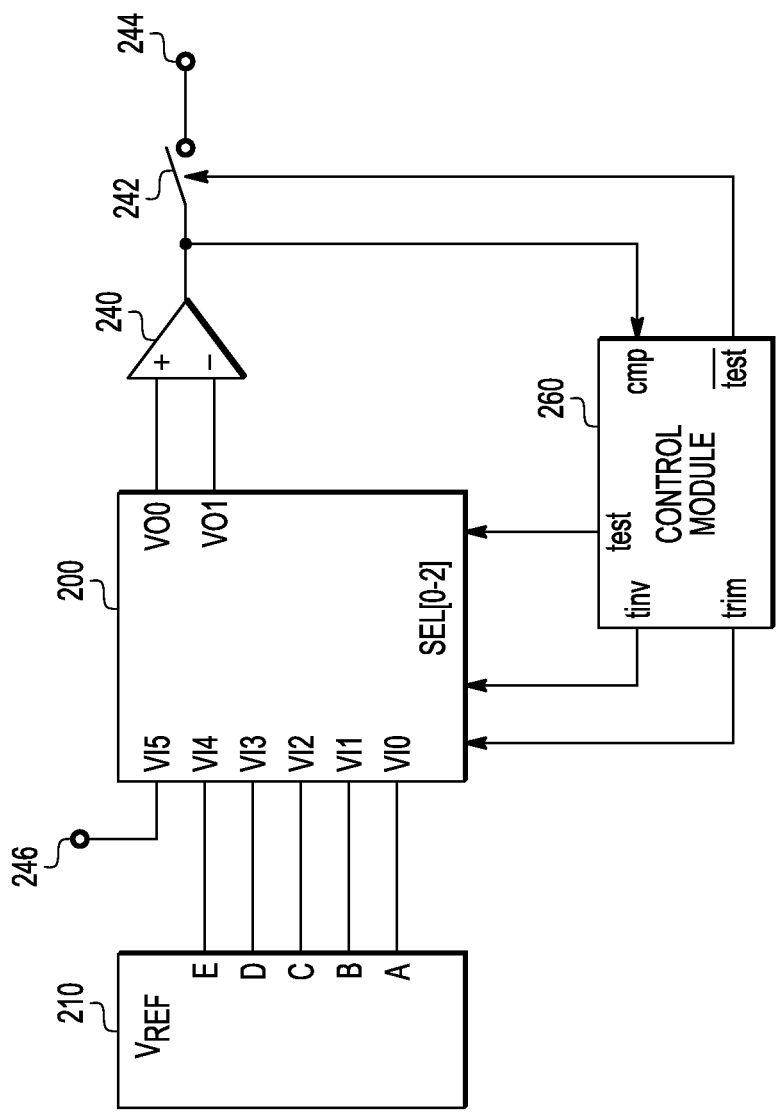
FIG. 2 is a block diagram illustrating a portion of the electronic device of FIG. 1 according to an embodiment of the present disclosure.

FIG. 2 illustrates a particular embodiment of portions of device 100 according to a particular embodiment of the disclosure, and includes a voltage selection module 200, a voltage reference module 210, a comparator 240, an isolation device 242, an interconnect 244, and a control module 260.

Voltage reference module 210 includes outputs labeled A-E to provide various reference voltages. Voltage selection module 200 includes inputs labeled VI0-VI5 and SEL[0.2], and outputs labeled VO0 and VO1. Inputs VI0-VI4 are connected to outputs A-E of voltage reference module 210, respectively, and input VI5 is connected to an interconnect 246 that can receive a voltage to be monitored by the comparator 240. Control module 260 includes outputs labeled TRIM, TINV, TEST and TESTb, and an input labeled CMP. Outputs TRIM, TINV, and TEST are connected to inputs of the voltage routing module labeled SEL[0 . . . 2] respectively. Comparator 240 includes a positive input and a negative input connected to the outputs VO0 and VO1, respectively, and an output. Isolation device 242 includes a data input connected to the output of comparator 240, a select input connected to the TESTb output, and an output connected to an interconnect 244.

During operation, voltage reference module 210 provides various reference voltages having staggered voltages on outputs A-E, such that output A provides the lowest voltage and output E provides the highest voltage. Interconnect 246 provides a variable voltage to be monitored that has a voltage that is indicative of a condition of device 100.

During a normal operation mode, under control of the control module 260, the voltage selection module 200 selectively provides one of the reference voltages supplied on voltage inputs VI0-VI4 or the variable voltage supplied on voltage input VI5 to either the voltage output VO0 or to the voltage output VO1, and selectively provides the variable voltage on input V5 to the other of the two voltage outputs, VO0 or V01. During a test operation mode, under control of the control module 260, the voltage selection module 200 can determine a switching offset voltage of the comparator 240 by selectively providing an appropriate reference voltage supplied on voltage inputs VI0-VI4 to the voltage outputs VO0 and VO1, respectively.

Comparator 240 operates to compare the voltage levels of the voltages supplied on voltage outputs VO0 and V01. When the voltage level of the voltage supplied on voltage output VO0 is greater than the voltage level of the voltage supplied on voltage output VO1, then the output of comparator 240 is in a first state (e.g., a logic "1"). When the voltage level of the voltage supplied on voltage output VO0 is less than the voltage level of the voltage supplied on voltage output VO1, then the output of comparator 240 is in another state (e.g., a logic "0"). The output of comparator 240 is connected to the CMP input of control module 260 for monitoring, and is connected via isolation device 242 to interconnect 244 which will typically be connected to an additional load. Control module 260 provides the TRIM, TINV, and TEST outputs to voltage selection module 200 to control which voltages on the voltage inputs VI0-VI5 are supplied to which voltage outputs VO0 and V01. Control module 260 provides the TESTb output to the select input of isolation device 242, such that when TESTb is in a first state (e.g., a logic "1"), the output of comparator 240 is connected to interconnect 244, and when TESTb is another state (e.g., a logic "0"), the output of comparator 240 is isolated from interconnect 244.

In a normal operation mode, control module 260 has the TEST output de-asserted (e.g., a logic "0"), the TESTb output asserted (e.g., a logic "1"), and the TRIM output set to configure the voltage selection module 200 so that the variable voltage at voltage input VI5, and a voltage reference value received at one of inputs VI0-VI4 are provided by the voltage reference module 210 as output of voltages VO0 and VO1 of selection module 200. For example, voltage selection module 200 operates under the control of controller 260 to provide the variable voltage from voltage input VI5 to the voltage output VO0, and to provide a selected one of the reference voltages from VI0-VI4 to the voltage output V01. The particular reference voltage that is selected by voltage selection module 200 is determined based upon the value of the output provided by the TRIM output. Also, since the TESTb output is asserted (e.g., a logic "1"), isolation device 242 is operated to connect the output of comparator 240 to interconnect 244. Thus, in the normal operation mode, the select reference voltage serves as a reference voltage for comparator 240, and the variable voltage supplied on interconnect 246 is compared to the reference voltage by the comparator. Thus, when the variable voltage is higher than the reference voltage, a logic "1" is supplied on the output of comparator 240 to interconnect 244, and when the variable voltage is lower than the reference voltage, a logic "0" is supplied onto the load.

In a test mode, control module 260 has the TEST output asserted (e.g., a logic "1"), the TESTb output de-asserted (e.g., a logic "0"), and the TRIM output set to provide another output value to voltage selection module 200. The TINV output can be de-asserted or can be asserted, as described below. In a first portion of the test mode, the TINV output is de-asserted (e.g., a logic "0"). As a result, voltage selector module 200 operates to provide a reference voltage from one of the voltage inputs VI0-VI4 (e.g., the highest output voltage E from voltage reference module 210) to the voltage output VO0, and to provide another one of the remaining reference voltages input VI0-VI4 to the voltage output VO1. In accordance with a particular embodiment, the reference voltage at input VI4 and a reference voltage selected by the signal TRIM are provided to the outputs of voltage selection module. Also, since the TESTb output is de-asserted (e.g., a logic "0"), isolation device 242 is operated to isolate the output of comparator 240 from interconnect 244, and thus from any additional loading.

In a second portion of the test mode, the TINV output is asserted (e.g., transitions from a logic "0" a logic "1"). As a result, voltage selector module 200 operates to swap the voltages being provided at outputs VO0 and V01. For example, if during the first portion, the voltages at VI4 and VI3 are being respectively provided to VO0 and VO1, during the second portion of the test mode the voltages at VI4 and VI3 will be respectively provided to VO1 and VO0. Thus, in the first portion of the test mode, the voltage outputs of voltage selector module 200 are such that a more positive voltage is supplied to the positive input of comparator 240 than to the negative input, and in the second portion of the test mode, the voltage outputs of the voltage selector module are such that the more positive voltage is supplied to the negative input of comparator 240.

It is noted that, in ideal circumstances, comparator 240 switches the state of its output at exactly the point where the voltage difference between its inputs crosses from a positive difference to a negative difference, and vice versa. However, in reality, comparator 240 may not meet this ideal, and the comparator may switch the state of its output at a point where the voltage difference between its inputs is somewhat positive or somewhat negative. This difference from the ideal circumstances is described as the switching voltage offset for comparator 240. It may be advantageous to know the switching voltage offset for comparator 240, and whether the switching voltage offset is a positive voltage, or a negative voltage.

Figure 3:
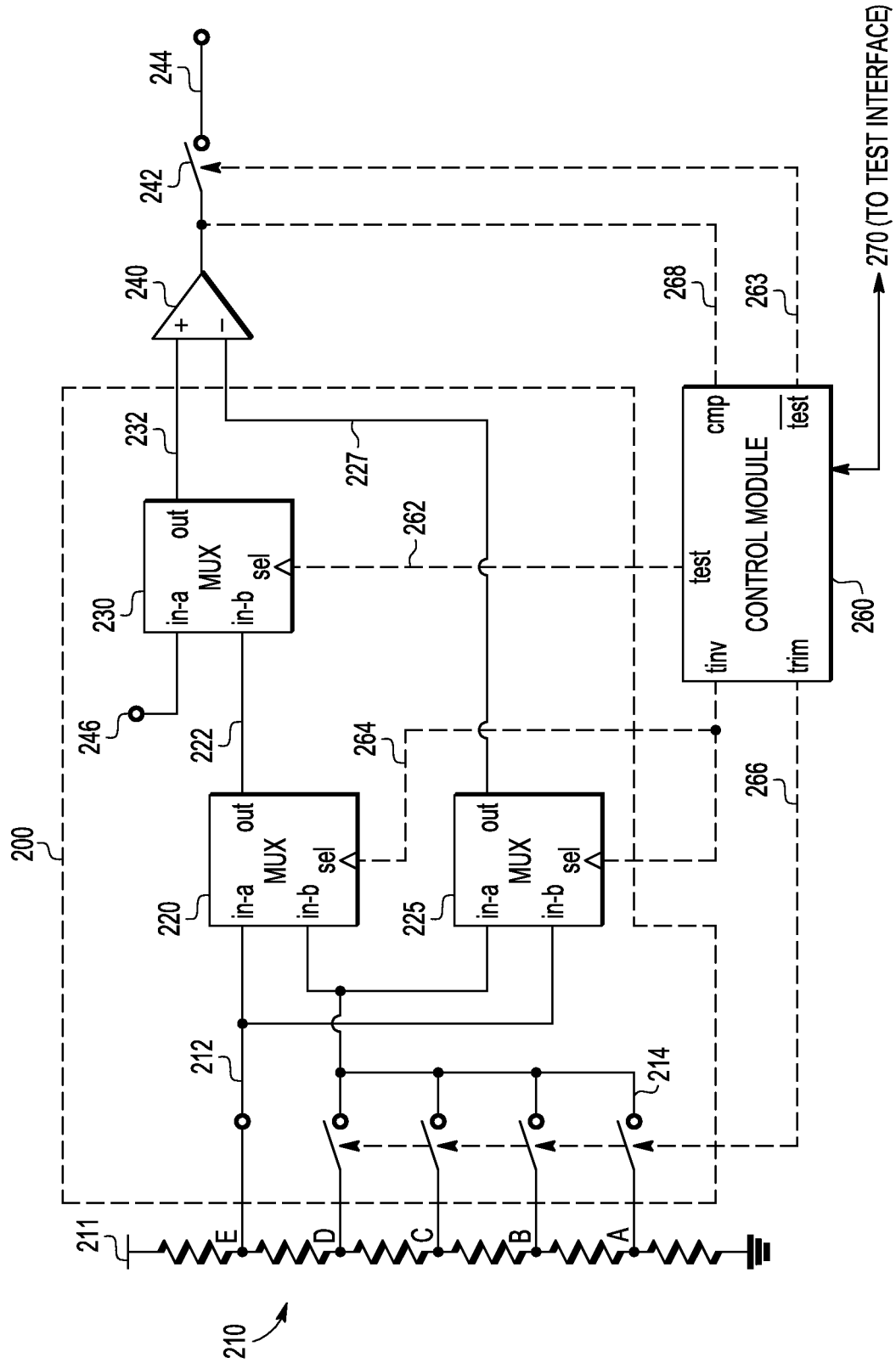
FIG. 3 is a block diagram illustrating a comparator test circuit for an indicator in a power management system of the electronic device of FIG. 1, according to an embodiment of the present disclosure.

FIG. 3 illustrates particular embodiments of the portions of device 100 illustrated in FIG. 2, including a particular embodiment of the voltage reference module 210, control module 260, and a voltage selection module 200. Voltage selection module 200 includes multiplexers (MUXs) 220, 225, and 230, a comparator 240, and an isolation device 242. Voltage selection module 200 is a particular embodiment of power status indicator 124 of FIG. 1. Voltage reference module 210 is embodied in FIG. 3 as a RDAC 126 that includes a set of resistors, selectable outputs A-E, also referred to as taps A-E, and a voltage at input 211. Voltage reference module 210 can provide for a 3 mV step between adjacent taps, or can provide for another step size, as needed or desired.

Tap E 212 of voltage reference module 210 is connected to input IN-A of MUX 220, and to input IN-B of MUX 225. One of the plurality of taps A-D is connected to input IN-B of MUX 220 and to input IN-A of MUX 225 via interconnect 214. An output of MUX 220 is connected to an input IN-B of MUX 230 via interconnect 222. An interconnect 246 is connected to input IN-A of MUX 230 to provide a variable voltage signal that is being regulated. An output of MUX 230 is connected to a positive input of comparator 240 via an interconnect 232. An output of MUX 225 is connected to a negative input of comparator 240 via interconnect 227. An output of comparator 240 is selectively connected to interconnect 244 through isolation device 242 to provide a control signal to subsequent elements, such as a voltage regulator.

Control module 260 is connected to a test interface 270 that operates to write bits to various test registers, and to read the bits from the various test registers of control module 260. Control module 260 includes one or more operational registers (not shown) that operate to control the operation of voltage selection module 200 based upon their contents, and to determine status information from the voltage selection module. In particular, operational registers provide a logic signal to an output labeled TRIM that is connected to interconnect 266 to select one of the plurality of taps A-D of voltage reference module 210 to provide to a reference voltage to inputs IN-B and IN-A of MUX 220 and MUX 225, respectively.

Operational registers also provide a logic signal to an output labeled TINV that is connected to a select input of MUX 220 and to a select input of MUX 225 via an interconnect 264, and that operates to select the input IN-A of MUX 220 and the input IN-A of MUX 225 when de-asserted, and to select the input IN-B of MUX 220 and the input IN-B of MUX 225 when asserted. Operational registers also provide a logic signal to an output labeled TEST that is connected to a select input of MUX 230 via interconnect 262, and operates to select the input IN-A of MUX 230 when de-asserted, and to select the input IN-B of MUX 230 when asserted. Operational registers also provide a logic signal to interconnect 263 that provides an inverted version of the TEST output signal that operates to close the isolation device 242 when de-asserted (i.e., to connect the output of comparator 240 to interconnect 244, and to open the isolation device when asserted (i.e., to isolate the output of comparator 240 from interconnect 244). Control module 260 also receives a logic signal at an signal labeled CMP that is connected to the output of comparator 240, via interconnect 268, and operates to monitor the logic state of the output of the comparator 240. Test interface 270 can include a scan chain interface access, or an access that can read and write registers directly.

Voltage selection module 200 has two modes of operation, a normal operation mode, and a test mode. In the normal operation mode, TEST output 262 is de-asserted, such that MUX 230 operates to select the input IN-A, thereby providing the variable voltage signal at interconnect 246 to the positive input of comparator 240, and the inverted version of TEST output 263 is asserted such that isolation device 242 is closed, thereby connecting the output of comparator 240 to interconnect 244. TRIM output 266 is operated to provide a selected one of taps A-D to be connected to interconnect 212 to provide a selected reference voltage level to the input IN-B of MUX 220 and to the input IN-A of MUX 225. TINV output 264 is de-asserted, such that MUX 225 operates to select the input IN-A, thereby providing the selected reference voltage level to the negative input of comparator 240. The result in the normal operation mode is that comparator 240 compares the variable voltage signal from interconnect 246 against the selected reference voltage level, such that when the variable voltage signal is higher than the selected reference voltage level, an output signal at interconnect 244 carries a logic "1," and when the variable voltage signal is lower than the selected reference voltage level, the output signal carries a logic "0."

Figure 4:
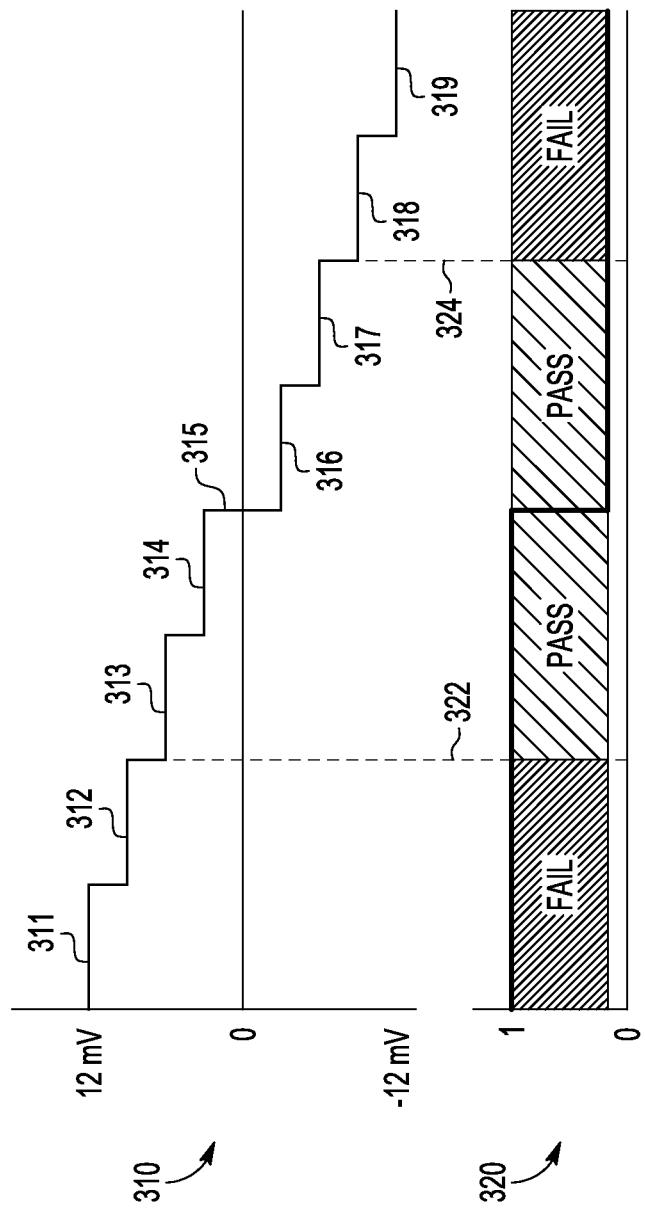
FIG. 4 is a graphical representation of the results from performing a test procedure on the indicator of FIG. 3, according to an embodiment of the present disclosure.

In the test mode, an asserted logic signal is provided to the TEST output (TEST signal), and signals from TINV and TRIM are varied as described in greater detail below to determine a voltage switching offset of the comparator 240. In response to the TEST signal being asserted, MUX 230 operates to select input IN-B, thereby providing signals received via interconnect 222 to the positive input of comparator 240 via interconnect 232, and isolation device 242 is opened, thereby isolating the output of comparator 240 from any loads associated with interconnect 244. TRIM output 266 is provided to voltage reference module 210 to select one of the plurality of taps A-D to provide an offset voltage, relative to the voltage at the positive input of comparator 240, to interconnect 214. In the test mode, TINV output 264 is either de-asserted or asserted. When TINV output 264 is de-asserted, the input IN-A of MUX 220 is selected, the reference voltage from tap E is provided on the output 222 of MUX 220, and is provided through MUX 230 to the positive input of comparator 240. Also, when TINV output 264 is de-asserted, the input IN-A of MUX 225 is selected, the offset voltage from one of taps A-D is provided on the output of MUX 225, and is provided to the negative input of comparator 240. Thus when TINV is de-asserted, positive voltage offsets are provided on the inputs of comparator 240. When TINV output 264 is asserted, the offset voltage is provided through MUX 220 and MUX 230 to the positive input of comparator 240, and the reference voltage is provided through MUX 225 to the negative input of comparator 240. Thus when TINV output 264 is asserted, negative voltage offsets are provided on the inputs of comparator 240. CMP input 268 receives output 268 of comparator 240, and operates to detect changes in state of the output from a logic "0" to a logic "1," and vice versa FIG. 4 is a graphical representation of the results from performing a test procedure in the test mode to determine the switching offset voltage for comparator 240, and includes an input offset voltage graph 310, and an output state graph 320. As an initial state in the test procedure, TEST output 262 is asserted and TINV output 264 is de-asserted, and positive voltage offsets are provided on the inputs of comparator 240. Also, TRIM output 266 is set to select the tap of voltage reference module 210 labeled "A," thereby providing an offset voltage level that is four steps lower than the reference voltage selected by the first tap. As an illustrative example, each tap will be considered to provide a 3 mV difference in voltage from the next adjacent tap. Thus, by selecting tap A, a positive 12 mV offset is provided to the input of comparator 240, as shown at step 311 of offset voltage graph 310. At an input offset voltage of 12 mV, the output of comparator 240 is a logic "1," as determined by the CMP input. Next, TRIM output is set to select the tap of voltage reference module 210 labeled "B," thereby providing a positive 9 mV offset to the input of comparator 240, as shown at step 312. Output of the comparator 240 is monitored by the CMP input to determine if the output has changed state from a logic "1" to a logic "0."

If so, the switching offset is determined to be between 12 mV and 15 mV, which represents a test that has failed, and the test procedure can be halted.

However, if the output has not changed state, the test procedure continues, the TRIM output is set to select the tap of voltage reference module 210 labeled "C," thereby providing a positive 6 mV offset to the input of comparator 240, as shown at step 313, and the output of the comparator 240 is monitored by the CMP input to determine if the output of the comparator 240 has changed state. If so, the switching offset is between 9 mV and 12 mV, which represents a test that has passed. If not, then the test procedure proceeds in a similar manner, with TRIM output providing a value to select the tap labeled "D" to provide a 3 mV offset, as shown at step 314. If there is still no change in the output state of the comparator 240, then the output TINV output is asserted, as shown at step 315, thereby swapping the voltages provided at outputs of MUX 220 and MUX 225, resulting in a negative offset voltage of −3 mV to the inputs of comparator 240. If there is still no change in the output state of comparator 240, then the test procedure continues with output TRIM being set to select tap C to provide an offset voltage of −6 mV. Similarly, output TRIM is successively set to select taps B and A, successively, thereby providing offset voltages of −9 mV and −12 mV, respectively, as needed. In another embodiment, the test procedure begins with output TINV asserted, and the negative voltage offsets are tested first. Then output TINV is de-asserted to test the positive voltage offsets.

A pass/fail criteria can be established for comparator 240, as illustrated in output state graph 320. For example, a pass/fail criteria of +/−9 mV can be established, as illustrated by the dashed lines 322 and 324. Thus, in the test procedure, if the state of output 268 changes at 312 then the switching offset is greater than +9 mV and the comparator fails. Likewise, if the state of output 268 changes at 318 or 319 then the switching offset is greater than −9 mV and the comparator fails. However, if output 268 changes at 313, 314, 316, or 317 then the switching offset is between +9 mV and −9 mV, and the comparator passes.

Figure 5:
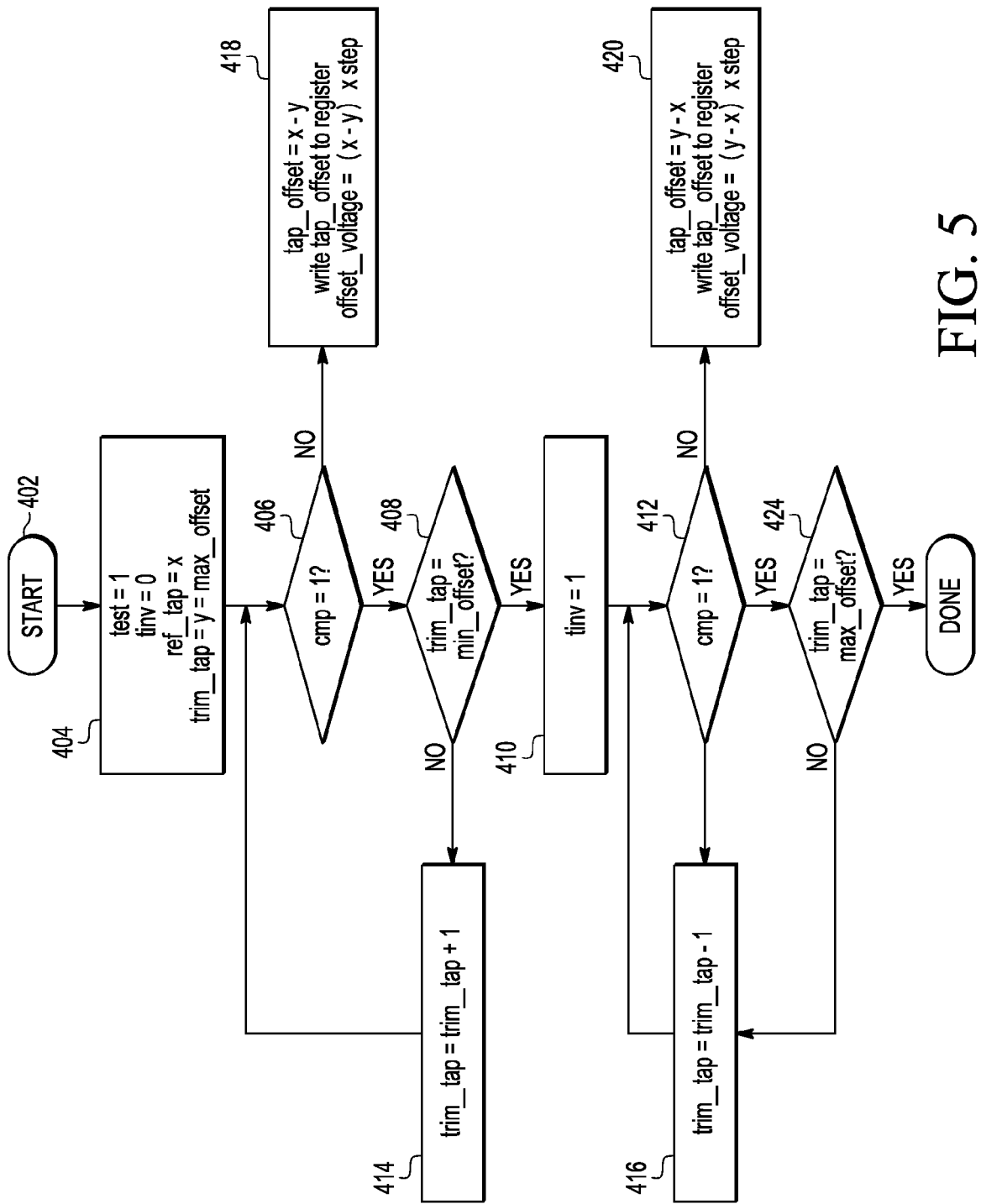
FIG. 5 is a flowchart illustrating a method of automatically testing comparator switching offsets in the power management system of the electronic device of FIG. 1, according to an embodiment of the present disclosure.

FIG. 5 is a flowchart illustrating a method of automatically testing a comparator switching offset of an integrated circuit that starts at block 402. At block 404, testing conditions are set up, including setting a test output (test) to a logic "1," setting an invert output (tiny) to a logic "0," setting a reference tap (ref_tap) indicator to a tap number "x," and setting an offset tap (trim_tap) indicator to a tap number "y" that represents a maximum offset voltage of a comparator to be tested. For example, referring to FIG. 3, TEST output 262 can be asserted, TINV output 264 can be de-asserted, tap E can be selected as the reference tap indicator, e.g., a tap number of 5, and TRIM output 266 can be set to select tap A as the offset tap indicator, e.g., a tap number of 1.

A decision is made as to whether or not a comparator output (cmp) is in a first state presumed herein to be a logic "1" at decision block 406. If so, then the "YES" branch of decision block 406 is taken to decision block 408, but if not, then the "NO" branch of decision block 406 is taken to block 418.

At block 408, in response to the "YES" branch of decision block 406 being taken, then a decision is made as to whether or not trim_tap is equal to a minimum offset voltage (min_offset) from the reference voltage. If so, then the "YES" branch of decision block 408 is taken to block 410, but if not, then the "NO" branch of decision block 408 is taken to block 414. At block 414, trim_tap is incremented such that:

$$\text{trim\_tap}=\text{trim\_tap}+1, \qquad \text{Equation 1}$$

to select the next offset voltage, and processing returns to decision block 406 where a decision is made as to whether or not cmp is a logic "1" based upon the updated voltage.

If trim_tap is equal to min_offset, and the "YES" branch of decision block 408 is taken to block 410, then the smallest positive voltage offset did not cause the comparator being tested to switch states, and the negative offset values need to be tested. Therefore, tiny is set to a logic "1," and flow proceeds to block 412. For example, TINV output 264 can be asserted. A decision is made as to whether or not cmp is a logic "1" at decision block 412. If so, then the "YES" branch of decision block 412 is taken to decision block 416 where the trim_tap is decremented to provide the next larger negative voltage to the comparator, but if not, then the "NO" branch of decision block 412 is taken to block 420. If cmp is a logic "1," and the "YES" branch of decision block 412 is taken to decision block 414, then a decision is made as to whether or not trim_tap is equal to the maximum offset voltage (max_offset) from the reference voltage. If so, then the "YES" branch of decision block 414 is taken to block 424 and processing ends, but if not, then the "NO" branch of decision block 414 is taken to block 416. At block 418, trim_tap is decremented such that:

$$\text{trim\_tap}=\text{trim\_tap}-1, \quad \text{Equation 2}$$

to select the next offset voltage, and processing returns to decision block 412 where a decision is made as to whether or not cmp is a logic "1."

Referring back to block 406, after flow proceeds to block 418 due to the state of the comparator having switched, a tap offset number (tap_offset) is defined based upon Equation 3, the value of tap_offset is written to an offset register, and the switching offset voltage for the comparator is determined based upon Equation 4.

$$\text{tap\_offset}=x-y=\text{ref\_tap}-\text{trim\_tap}, \quad \text{Equation 3}$$

and the switching offset voltage is determined as:

$$\text{Offset\_Voltage}=(x-y)*\text{step} \quad \text{Equation 4}$$

where step is the voltage per step (e.g., 3 mV per step).

Similarly, referring to block 420, after flow proceeds to block 420 due to the state of the comparator having switched, a tap offset number (tap_offset) is defined based upon the Equation 3, the value of tap_offset is written to an offset register, and the switching offset voltage, which is a negative value, for the comparator is determined based upon Equation 4.

Figure 6:
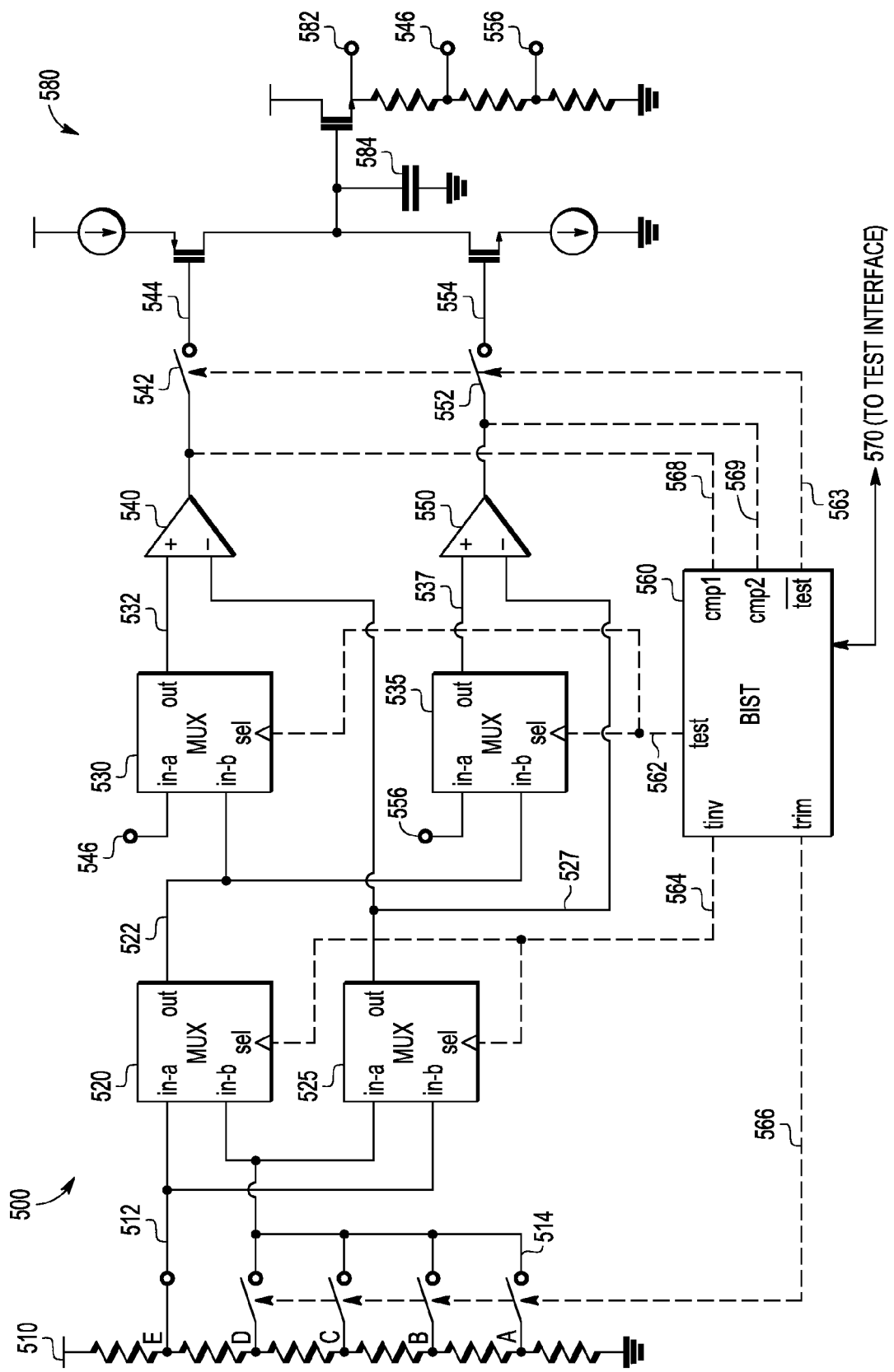
FIG. 6 is a block diagram illustrating a comparator test circuit for a voltage regulator in the power management system of the electronic device of FIG. 1, according to an embodiment of the present disclosure.

FIG. 6 illustrates an RDAC 510, a BIST block 560, and a voltage regulator 500 that includes MUXs 520, 525, 530 and 535, comparators 540 and 550, isolation devices 542 and 552, and a voltage regulator output stage 580. Voltage regulator 500 is similar to voltage regulator 200. A tap E of RDAC 510 is connected to input IN-A of MUX 520, and to an input IN-B of MUX 525. A selected one of a plurality of taps A-D is selectively connected to interconnect 514. Interconnect 513 is connected to input IN-B of MUX 520, and to an input IN-A of MUX 525. An output of MUX 520 is connected to an input IN-B of MUX 530, and to a input IN-B of MUX 535. An interconnect 546 is connected to input IN-A of MUX 530 to provide a reference voltage from a location having a voltage being regulated. An output of MUX 530 is connected to a positive input of comparator 540. An interconnect 556 is connected to input IN-A of MUX 535 to provide a reference voltage from a location having a voltage being regulated. An output of MUX 35 is connected to a positive input of comparator 550. An output of MUX 525 is connected to a negative input of comparator 540 and to a negative input of comparator 550. An output of comparator 540 is coupled through isolation device 542 to provide a low voltage output driver signal to an interconnect 544 of voltage regulator output stage 580. An output of comparator 550 is coupled through isolation device 552 to provide a high voltage output driver signal to an interconnect 554 of voltage regulator output stage 580. Voltage regulator output stage 580 includes a voltage regulator output 582, a resistor network that includes a node where interconnect 546 and interconnect 556 are connected to provide the low voltage detect input signal and the high voltage detect input signal, respectively. It will be recognized that voltage regulator output stage 580 may utilize various designs that are well known in the art, as needed or desired, and no further treatment of voltage regulator output stage 580 will be provided herein, except as needed to describe the various features of the disclosure.

BIST block 560 is connected to a test interface 570, and operates to control test registers, similar to the control module 260 of FIG. 1, to control the operation of voltage regulator 500. In addition, the test registers being controlled by the BIST block 560 include a second input labeled CMP2 to monitor the voltage state at the output of comparator 550. It will be appreciated, therefore, that during operation, the BIST block 560 simultaneously tests both of the comparator 540 and comparator 560. In addition, the BIST block can monitor additional comparators simultaneously by adding one additional multiplexor analogous to MUX 535, and by adding the ability to monitor the output of the additional comparator.

Voltage regulator 500 has two modes of operation, a normal operation mode, and a test mode. Similar to that described above, in the normal operation mode, one of the taps A-D is selected to set a reference voltage that is provided to the negative input of comparators 540 and 550 to regulate an output voltage at interconnect 582. Also in a similar manner as that described above, in the test mode of operation, two taps from the RDAC are selected and provided to the positive and negative inputs of comparator 540 and of comparator 550 to determine a switching offset voltage for each of the comparators. By monitoring the outputs of the comparators 540 and 550 separately, the switching offset of each comparator can be determined during a single test operation that iteratively selects each of the taps A-D Note that the normal operating mode can be momentarily interrupted to test the switching offset voltages of the comparators 540 and 550 without affecting voltage regulation of the voltage regulator. For example, after obtaining stable voltage regulation during normal operation, the mode can be switched to test mode, whereby holding capacitor 584 operates to hold a voltage level on the gate of the drive transistor, such that, when voltage regulator 500 is in test mode, voltage regulator output 582 is not affected by testing of the comparators, and thus remains stable. Note that voltage regulator output 582 drives a load (not illustrated) that includes a capacitive component, and that the level of voltage regulator output 582 will change slowly relative to the time needed to perform testing of comparators 540 and 550. Thus, when voltage regulator 500 is in test mode, isolation devices 542 and 552 operate to isolate voltage regulator output stage 580, and holding capacitor 584 provides a stable gate voltage level on the drive transistor for the duration of the test mode.

In a particular embodiment, a test procedure is run in the test mode that is similar to the test procedure described with reference to FIG. 4 above, and the switching offset voltages for comparators 540 and 550 are determined. In this way, one comparator switching offset can be determined, or multiple comparator switching offsets can be determined using the same test procedure. Moreover, the method described with reference to FIG. 5 above can be performed to determine the switching offset for a single comparator or for multiple comparators. In a particular embodiment, all comparators of a device can be determined simultaneously using a common RDAC, and multiplexers to provide the test mode reference voltages and offset voltages to the comparators, and applying the test procedures and methods described herein.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

The terms "assert" or "set" and "negate" (or "de-assert" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

As used herein, the term "bus" is used to refer to a plurality of signals or conductors that may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method for operating a comparator, the method comprising:
   in a first mode of operation, providing a first reference voltage of a plurality of reference voltages to a first input of a first comparator, the first comparator including an output to provide an indication of a comparison of a variable voltage received at a second input of the first comparator with the first reference voltage; and
   in a second mode of operation,
      providing a second reference voltage of the plurality of reference voltages to the first input of the first comparator and providing a third reference voltage of the plurality of reference voltages to the second input of the first comparator, wherein providing the second reference voltage and providing the third reference voltage further comprises selecting successive reference voltages of the plurality of reference voltages to be provided to the first and second inputs of the first comparator; and
      measuring a first switching offset voltage of the first comparator based on the second reference voltage and the third reference voltage;
      wherein selecting successive reference voltages of the plurality of reference voltages further comprises providing the second reference voltage to the second input of the first comparator and the third reference voltage to the first input of the first comparator prior to providing the second reference voltage to the first input of the first comparator and the third reference voltage to the second input of the first comparator.

2. The method of claim 1, wherein measuring the switching offset voltage of the first comparator further comprises determining a voltage difference between the second reference voltage and the third reference voltage.

3. The method of claim 1, wherein during the first mode of operation, the output of the first comparator drives an input of a voltage regulator to regulate the variable voltage.

4. The method of claim 3, further comprising:
   in the second mode of operation, isolating the output of the first comparator from the input of the voltage regulator.

5. The method of claim 1, further comprising in the second mode of operation:
   providing the second reference voltage of the plurality of reference voltages to a first input of a second comparator;
   providing the third reference voltage of the plurality of reference voltages to a second input of the second comparator; and
   measuring a second switching offset voltage of the second comparator based on the second reference voltage and the third reference voltage.

6. The method of claim 1, further comprising in the second mode of operation:
   providing the second reference voltage of the plurality of reference voltages to a first input of a second comparator;
   providing a fourth reference voltage of the plurality of reference voltages to a second input of the second comparator; and
   measuring second switching offset voltage of the second comparator based on the second reference voltage and the fourth reference voltage.

7. The method of claim 1, further comprising in the second mode of operation:
   providing a fourth reference voltage of the plurality of reference voltages to a first input of a second comparator;
   providing a fifth reference voltage of the plurality of reference voltages to a second input of the second comparator; and
   measuring a second switching offset voltage of the second comparator based on the fourth reference voltage and the fifth reference voltage.

8. The method of claim 1, wherein providing the second reference voltage and the third reference voltage is in response to a test routine of a built-in self test processor of an integrated circuit.

9. A method for measuring a switching voltage offset of a comparator, the method comprising:
provided a first reference voltage to a first input of the comparator and a second reference voltage to a second input of the comparator;
detecting that an output of the comparator is in a first state;
providing a third reference voltage to the second input;
responsive to determining that an output of the comparator has changed to a second state, measuring the switching voltage offset of the comparator as a difference in voltage between the first reference voltage and the third reference voltage; and
responsive to determining that the output has remained in the first state:
providing the first reference voltage to the second input and the third reference voltage to the first input; and
responsive to determining that the output is in the second state, measuring the switching voltage offset as the difference in voltage between the third reference voltage and the first reference voltage.

10. The method of claim 9, wherein providing the first reference voltage, the second reference voltage, and the third reference voltage is controlled by a built-in self test processor.

11. The method of claim 9, further comprising:
after providing the first reference voltage to the second input of the comparator and the third reference voltage to the first input of the comparator and responsive to determining that the output has remained in the first state:
providing the first reference voltage to the second input of the comparator and a fourth reference voltage to the first input; and
responsive to determining that the output is in the second state, measuring the switching voltage offset as the difference in voltage between the fourth reference voltage and the first reference voltage.

12. The method of claim 11, further comprising:
after providing the first reference voltage to the second input and the fourth reference voltage to the first input and responsive to determining that the output has remained in the first state, providing an indication that the comparator is a defective comparator.

13. The method of claim 9, further comprising:
providing the first reference voltage, the second reference voltage, and the third reference voltage by selecting associated taps of a resistor digital-to-analog converter (RDAC).

14. The method of claim 13, wherein the first reference voltage is associated with a first tap of the RDAC that provides a highest voltage level, the third reference voltage is associated with a third tap of the RDAC that provides a voltage level that is less than the first tap, and the second reference voltage is associated with a second tap of the RDAC that provides a voltage level that is less than the third tap.

15. The method of claim 9, wherein the comparator output drives an input of a voltage regulator.

16. A device comprising:
a comparator comprising a first comparator input, a second comparator input, and a comparator output;
a selection circuit, including a first selector output coupled to the first comparator input and a second selector output coupled to the second comparator input, the selection circuit including a first plurality of selector inputs, each of the first plurality of selector inputs coupled to receive a reference voltage of a corresponding plurality of reference voltages, the selection circuit including a first selector input coupled to receive a variable voltage:
wherein:
during a first mode of operation, the selection circuit provides the variable voltage to the first comparator input and provides a first selected voltage of the plurality of reference voltages to the second comparator input, wherein the comparator provides at the comparator output an indication of a comparison of the variable voltage and the first selected voltage;
during a second mode of operation, the selection circuit provides a second selected voltage of the plurality of reference voltages to the first comparator input and a third selected voltage of the plurality of reference voltages to the second comparator input, and the device measures a switching offset voltage of the comparator based on the second selected voltage and the third selected voltage, wherein providing the second reference voltage and providing the third reference voltage further comprises selecting successive reference voltages of the plurality of reference voltages to be provided to the first and second inputs of the first comparator; and,
wherein selecting successive reference voltages of the plurality of reference voltages further comprises providing the second reference voltage to the second input of the first comparator and the third reference voltage to the first input of the first comparator prior to providing the second reference voltage to the first input of the first comparator and the third reference voltage to the second input of the first comparator.

17. The device of claim 16, wherein during the second mode of operation, the selection circuit selectively couples different selector inputs of the first plurality of selector inputs to the first comparator input to provide different reference voltages prior to providing the first selected voltage to the second comparator input and the second selected voltage to the first comparator input.

18. The device of claim 16, wherein during the second mode of operation, the selection circuit selectively provides the second selected voltage to the second comparator input and the third selected voltage to the first comparator input, prior to providing the second selected voltage to the first comparator input and the third selected voltage to the second comparator input.

19. The device of claim 16, wherein the selection circuit measures the switching offset voltage as a voltage difference between the second selected voltage and the third selected voltage.

20. The device of claim 16, wherein:
during the first mode of operation, the comparator output drives an input of a voltage regulator to regulate the variable voltage; and
the device further comprises a switch coupled to the comparator output to isolate the comparator output from the input of the voltage regulator, wherein the switch is open during the second mode.

* * * * *